US011908872B2

(12) United States Patent
Cho et al.

(10) Patent No.: US 11,908,872 B2
(45) Date of Patent: Feb. 20, 2024

(54) DISPLAY DEVICE

(71) Applicant: Samsung Display Co., Ltd., Yongin-si (KR)

(72) Inventors: Young Jin Cho, Seoul (KR); Ji Su Na, Yongin-si (KR); Yang Wan Kim, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 175 days.

(21) Appl. No.: 17/518,230

(22) Filed: Nov. 3, 2021

(65) Prior Publication Data
US 2022/0139964 A1    May 5, 2022

(30) Foreign Application Priority Data
Nov. 4, 2020 (KR) .......................... 10-2020-0146154

(51) Int. Cl.
*H01L 27/12* (2006.01)
(52) U.S. Cl.
CPC ........ *H01L 27/124* (2013.01); *H01L 27/1225* (2013.01); *H01L 27/1248* (2013.01)
(58) Field of Classification Search
CPC .................................................. H01L 27/124
See application file for complete search history.

(56) References Cited

U.S. PATENT DOCUMENTS

| 2006/0250537 A1* | 11/2006 | Lee ...................... G02F 1/13624 349/43 |
| 2017/0223307 A1* | 8/2017 | Ono ......................... H04N 7/01 |
| 2021/0405411 A1* | 12/2021 | Hanada ............... H01L 27/1225 |
| 2022/0406257 A1* | 12/2022 | Gu ........................ G09G 3/3291 |
| 2023/0165080 A1* | 5/2023 | Xu ....................... G09G 3/3241 257/40 |

FOREIGN PATENT DOCUMENTS

| KR | 10-2015-0040152 A | 4/2015 |
| KR | 10-2015-0124922 A | 11/2015 |
| KR | 10-2016-0114219 A | 10/2016 |
| KR | 10-2019-0038727 A | 4/2019 |
| KR | 10-2020-0037027 A | 4/2020 |

* cited by examiner

*Primary Examiner* — Sang V Nguyen
(74) *Attorney, Agent, or Firm* — Lewis Roca Rothgerber Christie LLP

(57) ABSTRACT

A display device includes: a substrate; a first scan line arranged along a first direction on the substrate; a shield electrode overlapping a part of the first scan line in a direction that is perpendicular to a plane of the substrate; a second connection electrode on the shield electrode; and a data line arranged along a second direction on the second connection electrode, and connected with the second connection electrode, wherein the shield electrode overlapping the first scan line and the second connection electrode in a direction that is perpendicular to a plane of the substrate.

20 Claims, 14 Drawing Sheets

DISPLAY DEVICE

CROSS-REFERENCE TO RELATED APPLICATION

The present application claims priority to and the benefit of Korean Patent Application No. 10-2020-0146154 filed in the Korean Intellectual Property Office on Nov. 4, 2020, the entire content of which is incorporated herein by reference.

BACKGROUND

1. Field

Aspects of some embodiments of the present disclosure relate to a display device.

2. Description of Related Art

There are different categories of display device technology including, for example liquid crystal displays (LCDs), an organic light emitting diode (OLED) displays, and the like. Display devices may be used in various electronic devices such as portable telephones, navigation systems, digital cameras, electronic books, portable game devices, or various terminals.

A display device may include a plurality of pixels arranged in a row direction and a column direction. In each pixel, various components such as transistors, capacitors, and the like, and various wires that can supply signals to these devices, can be included.

Various wires can be arranged to overlap each other while arranging an insulating layer therebetween. When a voltage of some of wires changes instantaneously, it may affect the voltage of other overlapped wires.

The above information disclosed in this Background section is only for enhancement of understanding of the background and therefore the information discussed in this Background section does not necessarily constitute prior art.

SUMMARY

Aspects of some embodiments of the present disclosure relate to a display device, and for example, to a display device including a shield electrode that reduces coupling.

Aspects of some embodiments include a display device that can reduce coupling by including a shield electrode.

A display device according to some embodiments of the present invention includes: a substrate; a first scan line that is arranged along a first direction on the substrate; a shield electrode overlapping a part of the first scan line in a direction that is perpendicular to a plane of the substrate; a second connection electrode on the shield electrode; and a data line arranged along a second direction on the second connection electrode, and is connected with the second connection electrode, wherein the shield electrode overlaps the first scan line and the second connection electrode in a direction that is perpendicular to a plane of the substrate.

According to some embodiments, the shield electrode may be between the second connection electrode and the first scan line in an area where the second connection electrode and the first scan line overlap in a direction that is perpendicular to a plane of the substrate.

According to some embodiments, one edge of the second connection electrode may overlap the shield electrode in a direction that is perpendicular to a plane of the substrate.

According to some embodiments, the display device may further include an initialization control line, a second scan line, and a reference voltage line that are on the same layer as the shield electrode, wherein the initialization control line, the second scan line, and the reference voltage line may be arranged along the first direction.

According to some embodiments, the display device may further include a second initialization voltage line on the same layer as the second connection electrode, wherein the second initialization voltage line may further include a horizontal portion arranged along the first direction, and a plurality of horizontal portions protruding to the second direction.

According to some embodiments, the initialization control line may wholly overlap the horizontal portion of the second initialization voltage line in a direction that is perpendicular to a plane of the substrate in the horizontal portion between the vertical portions of the second initialization voltage line.

According to some embodiments, the shield electrode may be connected with the second initialization voltage line and may receive a second initialization voltage.

According to some embodiments, the shield electrode may be overlapping three or more corners of the second connection electrode in a direction that is perpendicular to a plane of the substrate.

According to some embodiments, the display device may further include: a first semiconductor layer between the substrate and the first scan line; and a second semiconductor layer that is arranged along a second direction on the first scan line, wherein the first semiconductor layer may include a polysilicon semiconductor layer, and the second semiconductor layer may include an oxide semiconductor layer.

According to some embodiments, the second semiconductor layer may overlap the second scan line and the initialization control line in a direction that is perpendicular to a plane of the substrate.

According to some embodiments, the display device may further include a first initialization voltage line, a light emission control line, and a bypass control line that are on the same layer as the first scan line, wherein the first initialization voltage line, the light emission control line, and the bypass control line may be arranged along the first direction, and the first initialization voltage line and the first scan line may overlap the second semiconductor layer in a direction that is perpendicular to a plane of the substrate.

According to some embodiments, the light emission control line and the bypass control line may overlap the first semiconductor layer in a direction that is perpendicular to a plane of the substrate.

According to some embodiments, the first semiconductor layer may form six transistors, and the second semiconductor layer may form two transistors.

According to some embodiments, the display device may further include: a driving voltage line that is on the same layer as the data line, and is arranged along the second direction; an eighth connection electrode that is on the same layer as the second connection electrode, wherein the driving voltage line and the eighth connection electrode may be connected with each other.

A display device according to some embodiments includes: a substrate; a first semiconductor layer that is on the substrate; a first gate conductive layer that is on the first semiconductor layer; a second gate conductive layer that is on the first gate conductive layer; a second semiconductor layer that is on the second gate conductive layer; a third gate conductive layer that is on the second semiconductor layer;

a first data conductive layer that is on the third gate conductive layer; and a second data conductive layer that is on the first data conductive layer, wherein the first gate conductive layer includes a first scan line, the third data conductive layer includes a shield electrode, the first data conductive layer includes a second connection electrode, and the shield electrode overlaps the first scan line and the second connection electrode in a direction that is perpendicular to a plane of the substrate.

According to some embodiments, the first data conductive layer may further include a second initialization voltage line, and the shield electrode is configured to supply a second initialization voltage from the second initialization voltage line.

According to some embodiments, the second data conductive layer may further include a data line, the data line is connected with the second connection electrode and thus supplies a data voltage to the second connection electrode, and the second connection electrode may be connected with the first semiconductor layer.

According to some embodiments, the second initialization voltage line may further include a horizontal portion arranged along the first direction and a plurality of horizontal portions protruding in the second direction, and a width of the horizontal portion of the second initialization voltage line, between the vertical portions, may be wider than other regions.

According to some embodiments, the shield electrode may overlap three or more corners of the second connection electrode in a direction that is perpendicular to a plane of the substrate.

According to some embodiments, the first semiconductor layer may include a polysilicon semiconductor, and the second semiconductor layer may include an oxide semiconductor.

According to some embodiments, a display device may reduce coupling (e.g., between different components or layers) by including a shield electrode.

DETAILED DESCRIPTION

Figure 1:
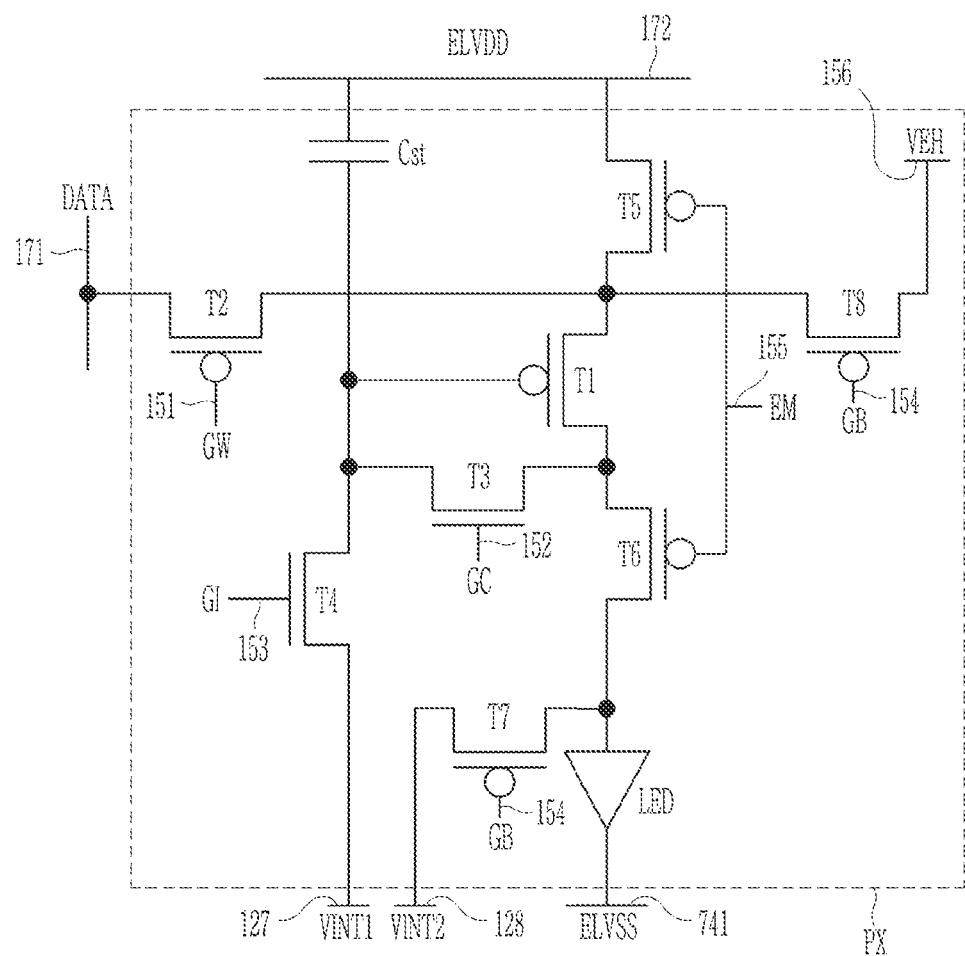
FIG. 1 is a circuit diagram of a pixel of a display device according to some embodiments.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In the drawings, size and thickness of each element are arbitrarily illustrated for convenience of description, and the present invention is not necessarily limited to as illustrated in the drawings. In the drawings, the thickness of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will not necessarily be understood to be positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a display device according to some embodiments of the present invention will be described with reference to the accompanying drawings.

FIG. 1 is a circuit diagram of a pixel of a display device according to some embodiments.

As shown in FIG. 1, a pixel PX of a display device according to some embodiments includes a plurality of transistors T1, T2, T3, T4, T5, T6, T7, and T8 connected with various signal lines, a storage capacitor Cst, and a light emitting diode LED. Embodiments according to the present disclosure are not limited thereto, however, and some embodiments may include additional components or fewer components without departing from the spirit and scope of embodiments according to the present disclosure.

A plurality of signal lines 127, 128, 151, 152, 153, 154, 155, 156, 171, 172, and 741 are connected to a single pixel PX. The plurality of signal lines include a first initialization voltage line 127, a second initialization voltage line 128, a first scan line 151, a second scan line 152, an initialization control line 153, a bypass control line 154, a light emission control line 155, a reference voltage line 156, a data line 171, a driving voltage line 172, and a common voltage line 741.

The first scan line 151 is connected to a gate driver and transmits a first scan signal GW to a second transistor T2. The second scan line 152 may be applied with a voltage of a polarity that is opposite to a polarity of a voltage applied to the first scan line 151 at the same timing of the signal of the first scan line 151. For example, when a high voltage is applied to the first scan line 151, a low voltage may be applied to the second scan line 152. The second scan line 152 transmits a second scan signal GC to the third transistor T3.

The initialization control line 153 transmits an initialization control signal GI to a fourth transistor T4. The bypass control line 154 transmits a bypass signal GB to a seventh transistor T7 and an eighth transistor. The control line 154 may be formed of the first scan line 151 at a rear end thereof. The light emission control line 155 transmits a light emission control signal EM to a fifth transistor T5 and a sixth transistor T6.

The data line 171 is a wire that transmits a data voltage DATA generated by a data driver, and luminance of light emitted from the light emitting diode LED is changed according to the data voltage DATA applied to the pixel PX.

The driving voltage line 172 applies a driving voltage ELVDD, and the reference voltage line 156 applies a reference voltage VEH. The first initialization voltage line 127 transmits a first initialization voltage VINT1, and the second initialization voltage line 128 transmits a second initialization voltage VINT2. The first initialization voltage VINT1 and the second initialization voltage VINT2 may be different from each other. The common voltage line 741 applies a common voltage ELVSS to a cathode of the light emitting diode LED. According to some embodiments, the driving voltage line 172, the reference voltage line 156, the first and second initialization voltage lines 127 and 128, and the common voltage line 741 may be respectively applied with constant voltages.

As shown in FIG. 1, one pixel may include eight transistors T1 to T8 and one storage capacitor Cst.

The driving transistor T1 may include polycrystalline semiconductor. In addition, the third transistor T3 and the fourth transistor T4 may include oxide semiconductors. The second transistor T2, the fifth transistor T5, the sixth transistor T6, the seventh transistor T7, and the eighth transistor T8 may include polycrystalline semiconductors. However, this is not restrictive, and at least one of the second transistor T2, the fifth transistor T5, the sixth transistor T6, the seventh transistor T7, or the eighth transistor T8 may include an oxide semiconductor. According to some embodiments, the third transistor T3 and the fourth transistor T4 include semiconductor materials that are different from a semiconductor material of the driving transistor T1, and thus more stable driving may be achieved and reliability may be improved.

Hereinafter, referring to FIG. 2 to FIG. 10, planar and cross-sectional structures of the display device according to some embodiments will be described in more detail.

Figure 2:
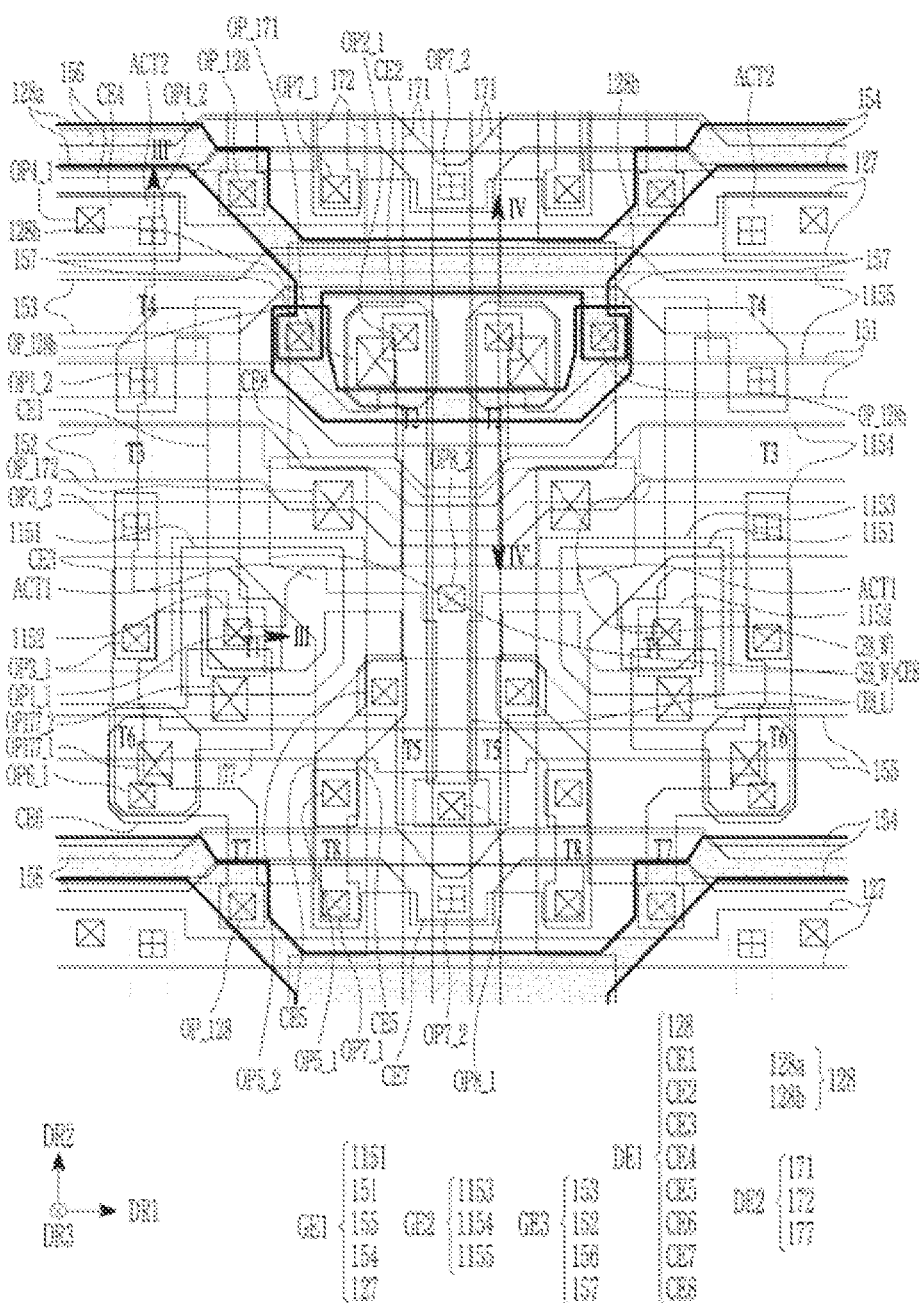
FIG. 2 is a top plan view of the display device according to some embodiments.
Figure 3:
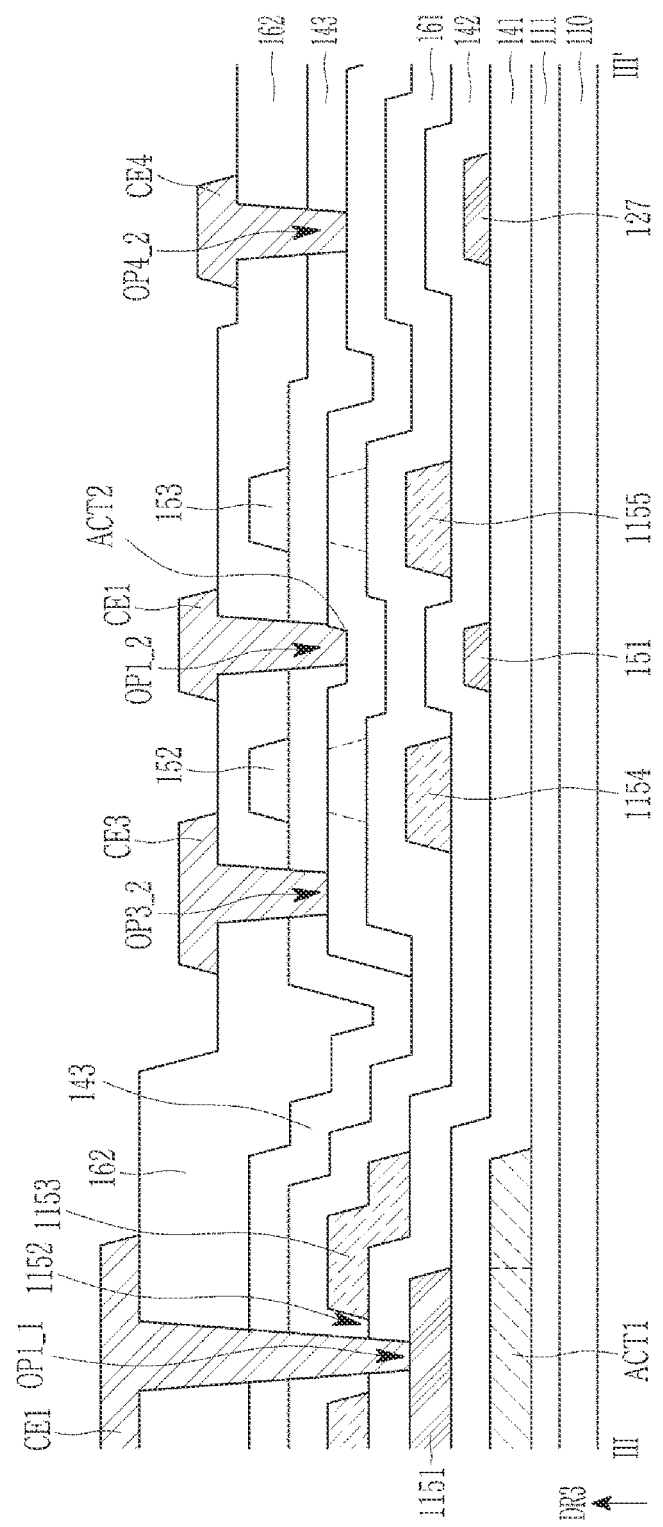
FIG. 3 is a cross-sectional view of FIG. 2, taken along the line III-III'.
Figure 4:
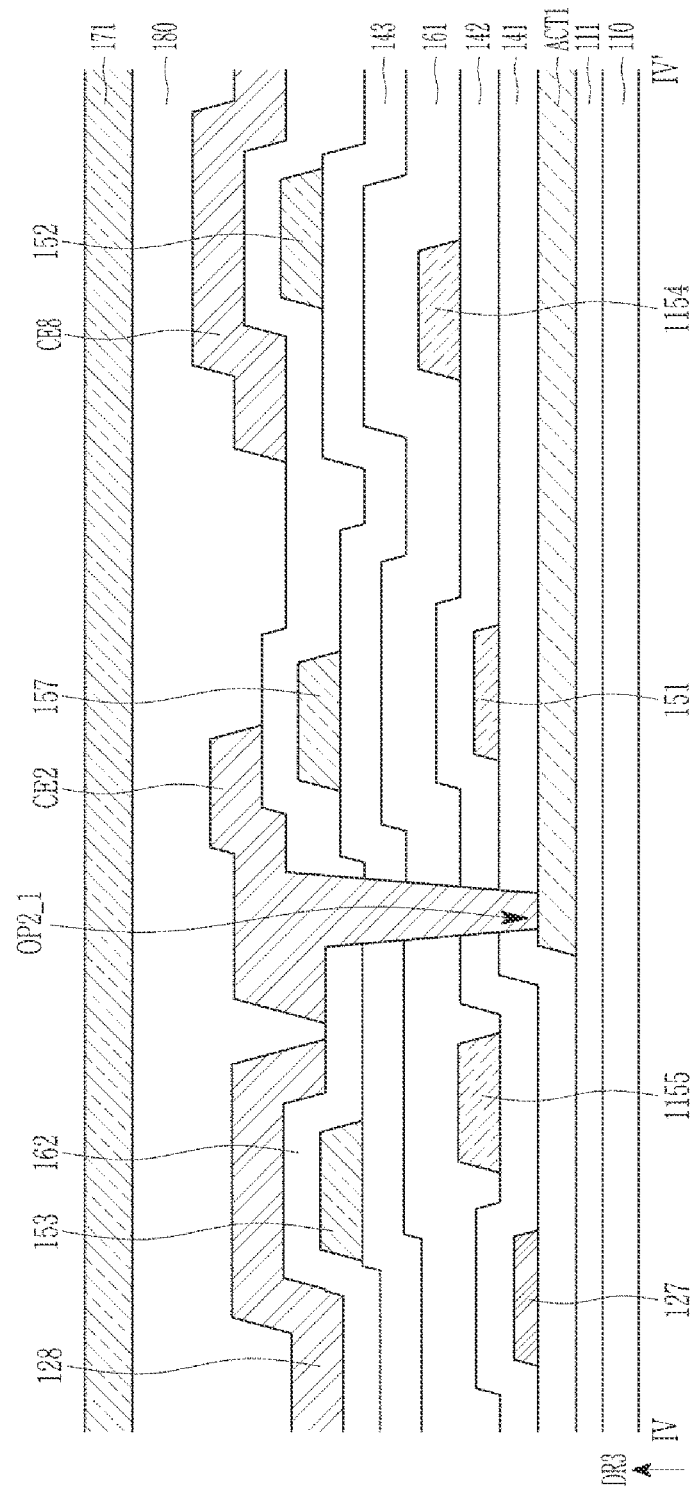
FIG. 4 is a cross-sectional view of FIG. 2, taken along the line IV-IV'.

FIG. 2 is a top plan view of the display device according to some embodiments, FIG. 3 is a cross-sectional view of FIG. 2, taken along the line III-III', and FIG. 4 is a cross-sectional view of FIG. 2, taken along the line IV-IV'. FIG. 5 to FIG. 10 are top plan views that sequentially illustrate a manufacturing order of the display device according to some embodiments. FIG. 2 to FIG. 10 illustrate two adjacent pixels, and the two pixels may have shapes that are symmetrical to each other.

As shown in FIG. 2 to FIG. 10, the first semiconductor layer ACT1 may be arranged on the substrate 110. The first semiconductor layer ACT1 may include a polysilicon semiconductor material.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. The substrate 110 may be a rigid substrate, or a flexible substrate that can be bent, folded, or rolled. The substrate 110 may be single-layered or multi-layered. The substrate 110 may be formed by alternately stacking at least one base layer that includes sequentially stacked polymer resin layers and at least one inorganic layer.

Figure 5:
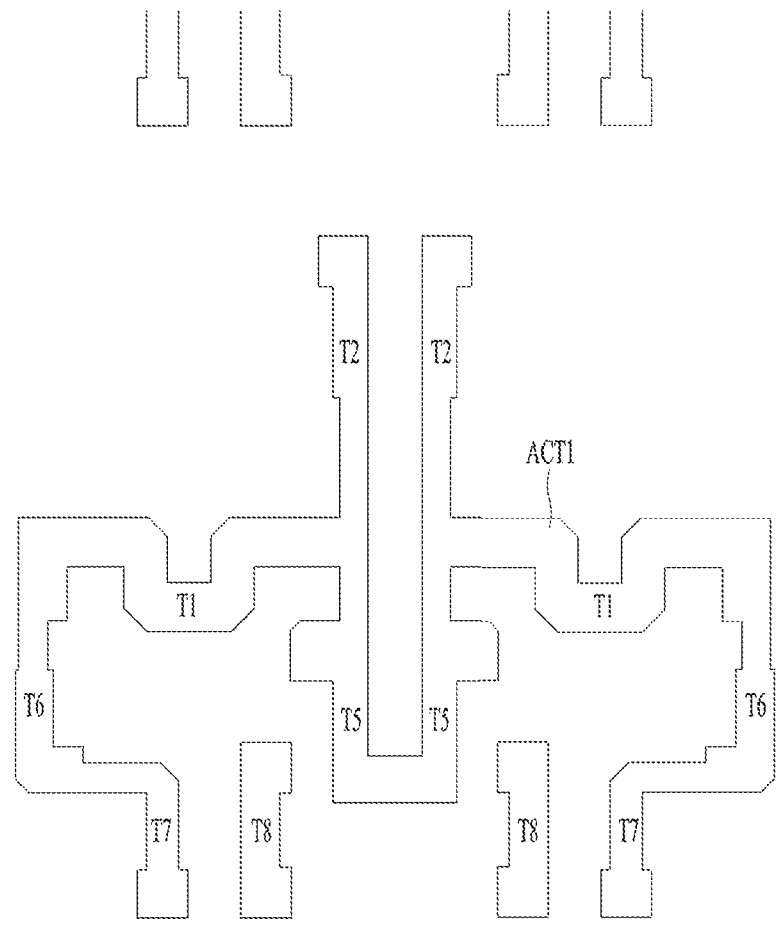
FIG. 5 to FIG. 10 are top plan views that sequentially illustrate a manufacturing order of the display device according to some embodiments.
Figure 5:
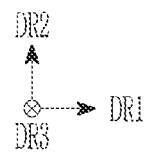

FIG. 5 illustrates the first semiconductor layer ACT1. The first semiconductor layer ACT1 may include a channel, a first electrode, and a second electrode of each of the driving transistor T1, the second transistor T2, the fifth transistor T5, the sixth transistor T6, the seventh transistor T7, and the eighth transistor. In FIGS. 2 to 10, each transistor is illustrated, and a channel of each transistor may be located at a center area of the transistor, while a first electrode and a second electrode of each transistor may be arranged at opposite sides of the channel.

The channel of the driving transistor T1 may have a shape that is curved on a plane. However, the shape of the channel of the driving transistor T1 is not limited thereto, and may be variously modified. For example, the channel of the driving transistor T1 may be bent in other shapes, and may be formed in the shape of a rod.

Referring to FIG. 3 and FIG. 4, a buffer layer 111 may be located between the substrate 110 and the first semiconductor layer ACT1. The buffer layer 111 may have a single-layered or multi-layered structure. The buffer layer 111 may include a silicon oxide (SiOx), a silicon nitride (SiNx), a silicon oxynitride (SiOxNy), and amorphous silicon (Si).

Referring to FIG. 3 and FIG. 4, a first gate insulating layer 141 may be arranged on the first semiconductor layer ACT1. The first gate insulating layer 141 may include a silicon oxide (SiOx), a silicon nitride (SiNx), and a silicon oxynitride (SiOxNy), and may have a single-layered or multi-layered structure including the same.

A first gate conductive layer GE1 may be arranged on the first gate insulating layer 141. The first gate conductive layer GE1 may include molybdenum (Mo), aluminum (Al), copper (Cu), and/or titanium (Ti), and a may have a single-layered or multi-layered structure including the same.

Figure 6:
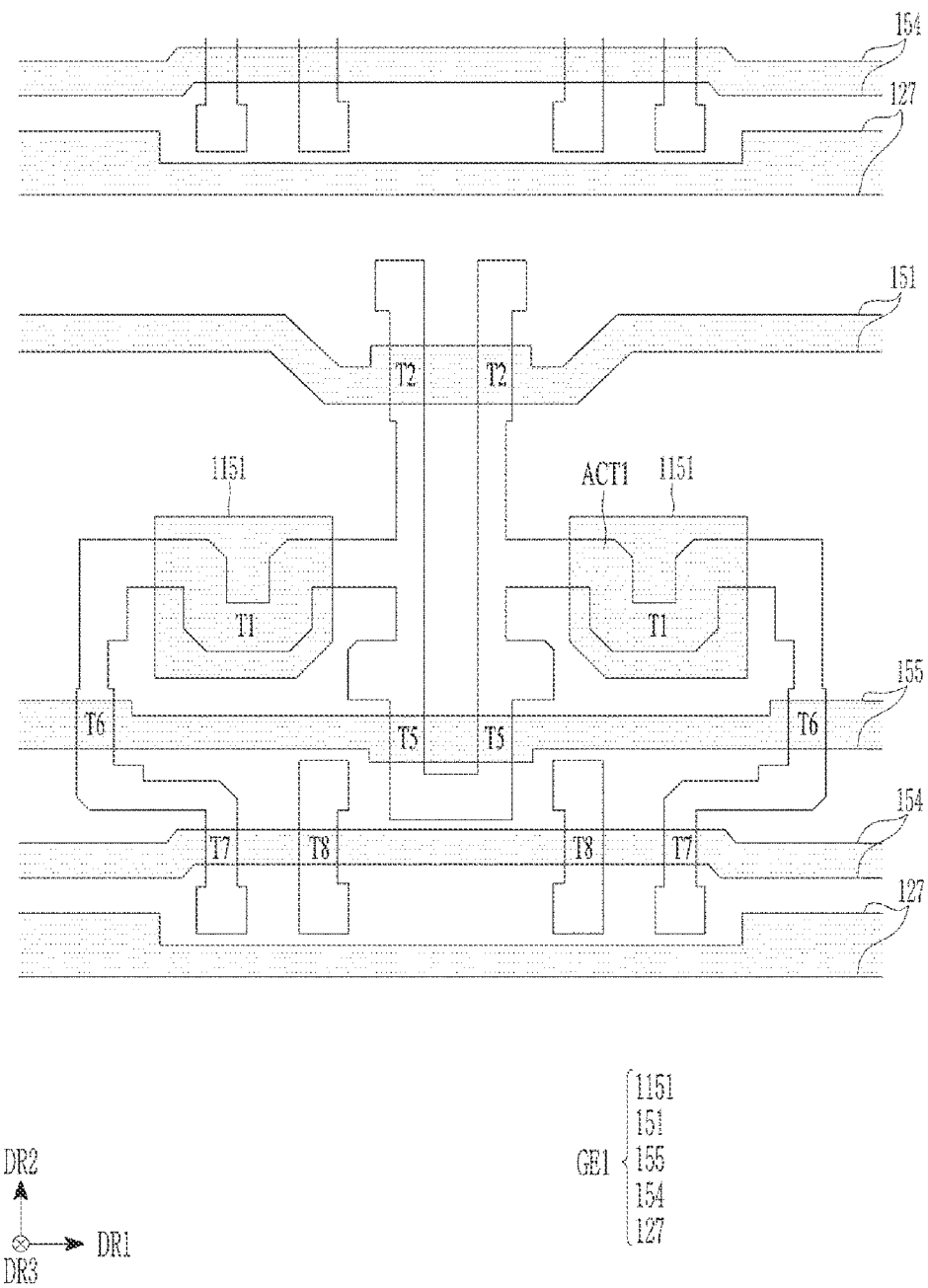

FIG. 6 illustrates the first semiconductor layer ACT1 and the first gate conductive layer GE1. The first gate conductive layer GE1 may further include a gate electrode 1151 of the driving transistor, a first initialization voltage line 127, a first scan line 151, a light emission control line 155, and a bypass control line 154.

The first initialization voltage line 127, the first scan line 151, the light emission control line 155, and the bypass control line 154 may be arranged along a first direction DR1.

A part of the first scan line 151 may be a gate electrode of the second transistor T2. A gate electrode of the fifth transistor T5 and a gate electrode of the sixth transistor T6 may be a part of the light emission control line 155. A gate electrode of the seventh transistor T7 and a gate electrode of the eighth transistor T8 may be a part of the bypass control line 154.

After forming a first gate conductive layer GE1 including the gate electrode 1151 of the driving transistor T1, a doping process may be performed. The first semiconductor layer ACT1 covered by the first gate conductive layer GE1 is not doped, and a portion of the first semiconductor layer ACT1, not covered by the first semiconductor layer ACT1, is doped and thus may have the same characteristic as a conductor. In this case, the doping process can be carried out with a P-type dopant, and the driving transistor T1, the second transistor T2, the fifth transistor T5, the sixth transistor T6, the seventh transistor T7, and the eighth transistor T8, which include the polycrystalline semiconductor ACT1, may have P-type transistor characteristics.

Simultaneously referring to FIG. 3, the first semiconductor layer ACT1 that does not overlap the gate electrode 1151 may have conductivity due to the doping, and an area overlapping with the gate electrode 1151 in a third direction DR3 that is perpendicular to the substrate 110 may be a channel of the driving transistor T1. Alternatively, a plasma process may be carried out instead of the doping process. The first semiconductor layer ACT1 may be conductive by the plasma process.

Simultaneously referring to FIG. 2 to FIG. 4, a second gate insulating layer 142 may be arranged on the first gate conductive layer GE1 that includes the gate electrode 1151, and the first gate insulating layer 141. The second gate insulating layer 142 may include a silicon oxide (SiOx), a silicon nitride (SiNx), and a silicon oxynitride (SiOxNy), and may have a single-layered or multi-layered structure including the same.

Figure 7:
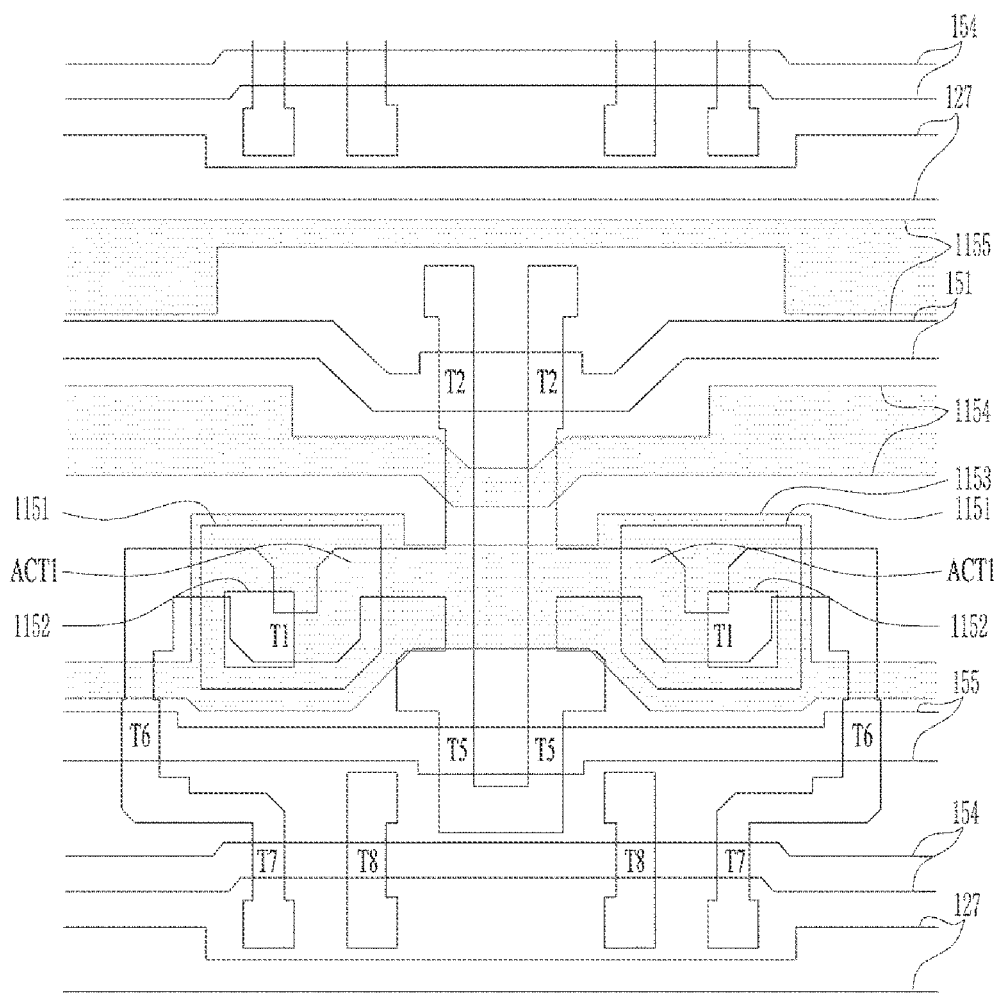

Referring to FIG. 2 to FIG. 4, and FIG. 7, a second gate conductive layer GE2 may be arranged on the second gate insulating layer 142. FIG. 7 illustrates the first semiconductor layer ACT1, the first gate conductive layer GE1, and the second gate conductive layer GE2. The second gate conductive layer GE2 may include molybdenum (Mo), aluminum (Al), copper (Cu), silver (Ag), chromium (Cr), tantalum (Ta), titanium (Ti), and the like, and may have a single-layered or multi-layered structure including the same.

The second gate conductive layer GE2 may include a first sustain electrode 1153 of the storage capacitor Cst, a first overlapped wire 1154, and a second overlapped wire 1155.

The first overlapped wire 1154 and the second overlapped wire 1155 may be arranged along the first direction DR1. Referring to FIG. 2, the first overlapped wire 1154 overlaps the second scan line 152 in the third direction DR3 that is perpendicular to a plane of the substrate 110, and the second overlapped wire 1155 may be arranged to overlap the initialization control line 153 in the third direction that is perpendicular to the plane of the substrate 110.

The first sustain electrode 1153 forms the storage capacitor Cst by overlapping the gate electrode 1151 of the driving transistor T1. An opening 1152 may be formed in the first sustain electrode 1153 of the storage capacitor Cst. The opening 1152 of the first sustain electrode 1153 of the storage capacitor Cst may overlap the gate electrode 1151 of the driving transistor T1. The first sustain electrodes 1153 may be connected with each other along the first direction DR1.

Simultaneously referring to FIGS. 2 to 4 and FIG. 7, a first interlayer insulation layer 161 may be located on the second gate conductor GE2 that includes the first sustain electrode 1153. The first interlayer insulating layer 161 may include a silicon oxide (SiOx), a silicon nitride (SiNx), and a silicon oxynitride (SiOxNy), and may have a single-layered or multi-layered structure including the same. A layer that includes a silicon nitride may be located closer to the substrate 110 than a layer that includes a silicon oxide in the first interlayer insulating layer 161.

Referring to FIG. 2 to FIG. 4, the second semiconductor layer ACT2 may be located on the first interlayer insulating layer 161. The second semiconductor layer ACT2 may be an oxide semiconductor layer. The second semiconductor layer ACT2 may include at least one of indium (In), tin (Sn), zinc (Zn), hafnium (Hf), or aluminum (Al). For example, the second semiconductor layer ACT2 may include indium-gallium-zinc oxide (IGZO).

Figure 8:
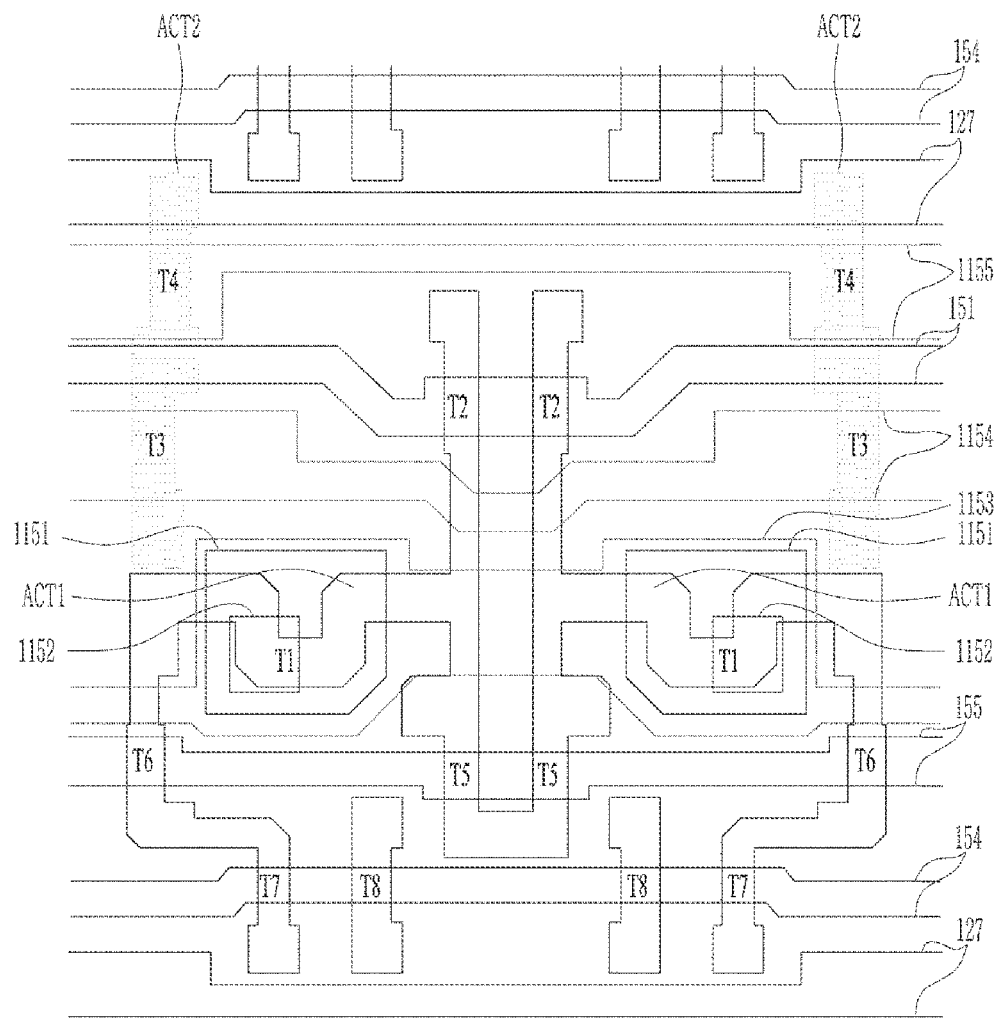

FIG. 8 illustrates the first semiconductor layer ACT1, the first gate conductive layer GE1, the second gate conductive layer GE2, and the second semiconductor layer ACT2.

The second semiconductor layer ACT2 may include a channel, a first electrode, and a second electrode of the third transistor T3, and a channel, a first electrode, and a second electrode of the fourth transistor T4.

Referring to FIG. 3 and FIG. 4, a third gate insulating layer 143 may be located on the second semiconductor layer ACT2. The third gate insulating layer 143 may include a silicon oxide (SiOx), a silicon nitride (SiNx), and a silicon oxynitride (SiOxNy), and may have a single-layered or multi-layered structure including the same.

Referring to FIG. 2 to FIG. 4, a third gate conductive layer GE3 may be located on the third gate insulating layer 143. The third gate conductive layer GE3 may include molybdenum (Mo), aluminum (Al), copper (Cu), and/or titanium (Ti), may have a single-layered or multi-layered structure including the same. For example, the third gate conductive layer GE3 may include a lower layer containing titanium and an upper layer containing molybdenum, and the lower layer containing titanium prevents the diffusion of fluorine (F), which is an etching gas, during dry etching of the upper layer.

Figure 9:
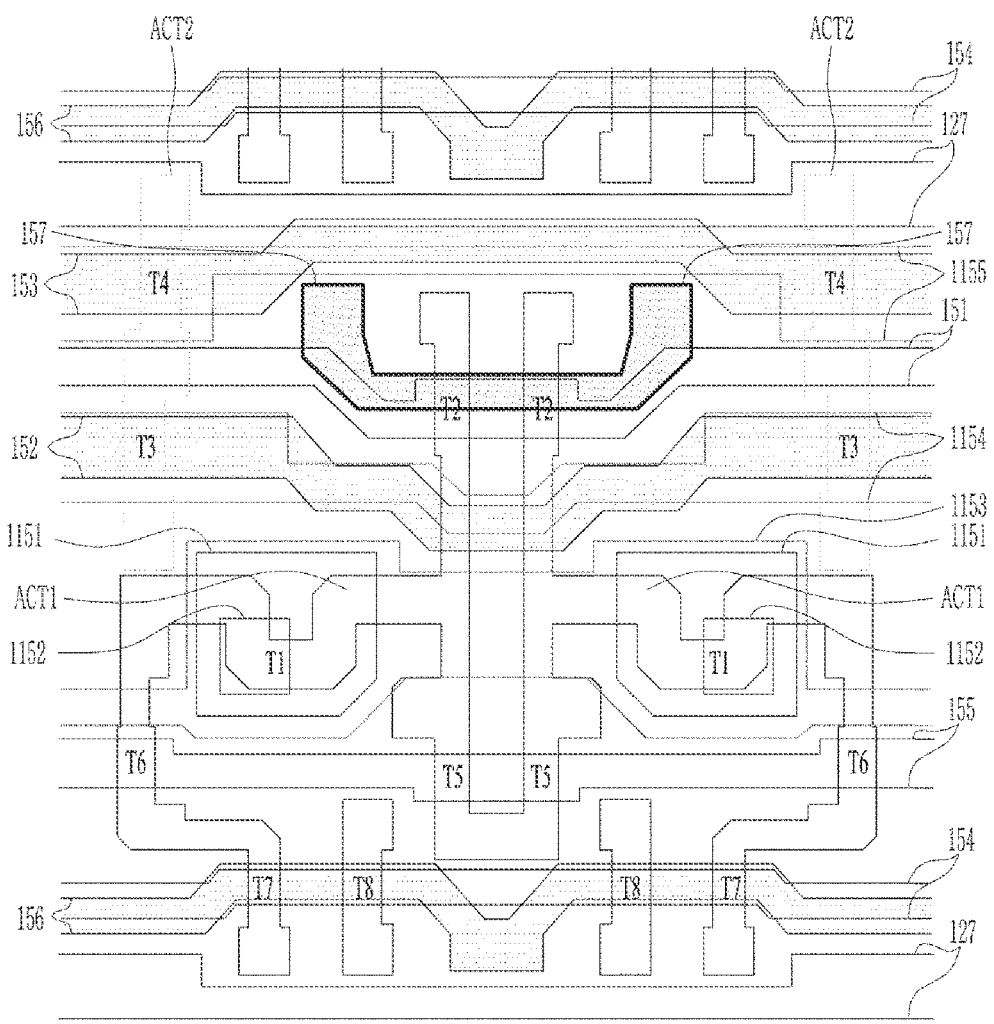
Figure 9:
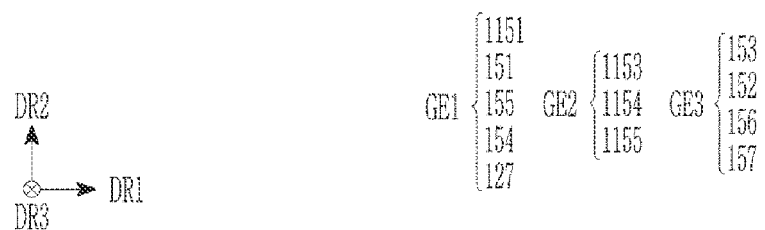

FIG. 9 illustrates the first semiconductor layer ACT1, the first gate conductive layer GE1, the second gate conductive layer GE2, the second semiconductor layer ACT2, and the third gate conductive layer GE3.

The third gate conductive layer GE3 may include an initialization control line 153, a second scan line 152, a reference voltage line 156, and a shield electrode 157. The initialization control line 153, the second scan line 152, and the reference voltage line 156 may be arranged along the first direction DR1. Simultaneously referring to FIG. 3, a part of the initialization control line 153 may be the gate electrode of the fourth transistor T4. A part of the second scan line 152 may be the gate electrode of the third transistor T3. The reference voltage line 156 may be connected with a first electrode of the eighth transistor T8.

Referring to FIG. 9, the shield electrode 157 may be arranged to be partially overlapping the first scan line 151 in the third direction that is perpendicular to the substrate 110. As will be described in more detail below, the shield electrode 157 may be connected to the second initialization voltage line 128 and may receive the second initialization voltage. In addition, simultaneously referring to FIG. 2 and FIG. 4, the shield electrode 157 is located between the second connection electrode CE2 and the first scan line 151 to reduce coupling therebetween. Further details and characteristics of the shield electrode 157 will be described later.

After forming the third gate conductive layer GE3, a doping process can be performed. A portion of the second semiconductor layer ACT2, covered by the third gate conductive layer GE3 is not doped, and a portion of the second semiconductor GE2 not covered by the third gate conductive layer GE3 is doped and thus may have the same characteristic as a conductor. Simultaneously referring to FIG. 3, the channel of the third transistor T3 is located below the gate electrode to overlap the second scan line 152, which is the gate electrode, in the third direction DR3 that is perpendicular to the substrate 110, and the first electrode and the second electrode of the third transistor T3 may not overlap the gate electrode.

Simultaneously referring to FIG. 3, the channel of the fourth transistor T4 may be located below the gate electrode to overlap the initialization control line 153, which is the gate electrode, in the third direction DR3 that is perpendicular to the substrate 110. The first electrode and the second electrode of the fourth transistor T4 may not overlap the gate electrode. The doping process of the second semiconductor layer ACT2 may be performed with an N-type dopant, and the third transistor T3 and the fourth transistor T4 including the second semiconductor layer ACT2 may have an N-type transistor characteristic.

Simultaneously referring to FIG. 2 to FIG. 4, a second interlayer insulating layer 162 may be located on the third gate conductive layer GE3. The second interlayer insulating layer 162 may include a silicon oxide (SiOx), a silicon nitride (SiNx), and a silicon oxynitride (SiOxNy), and may have a single-layered or multi-layered structure including the same.

Figure 10:
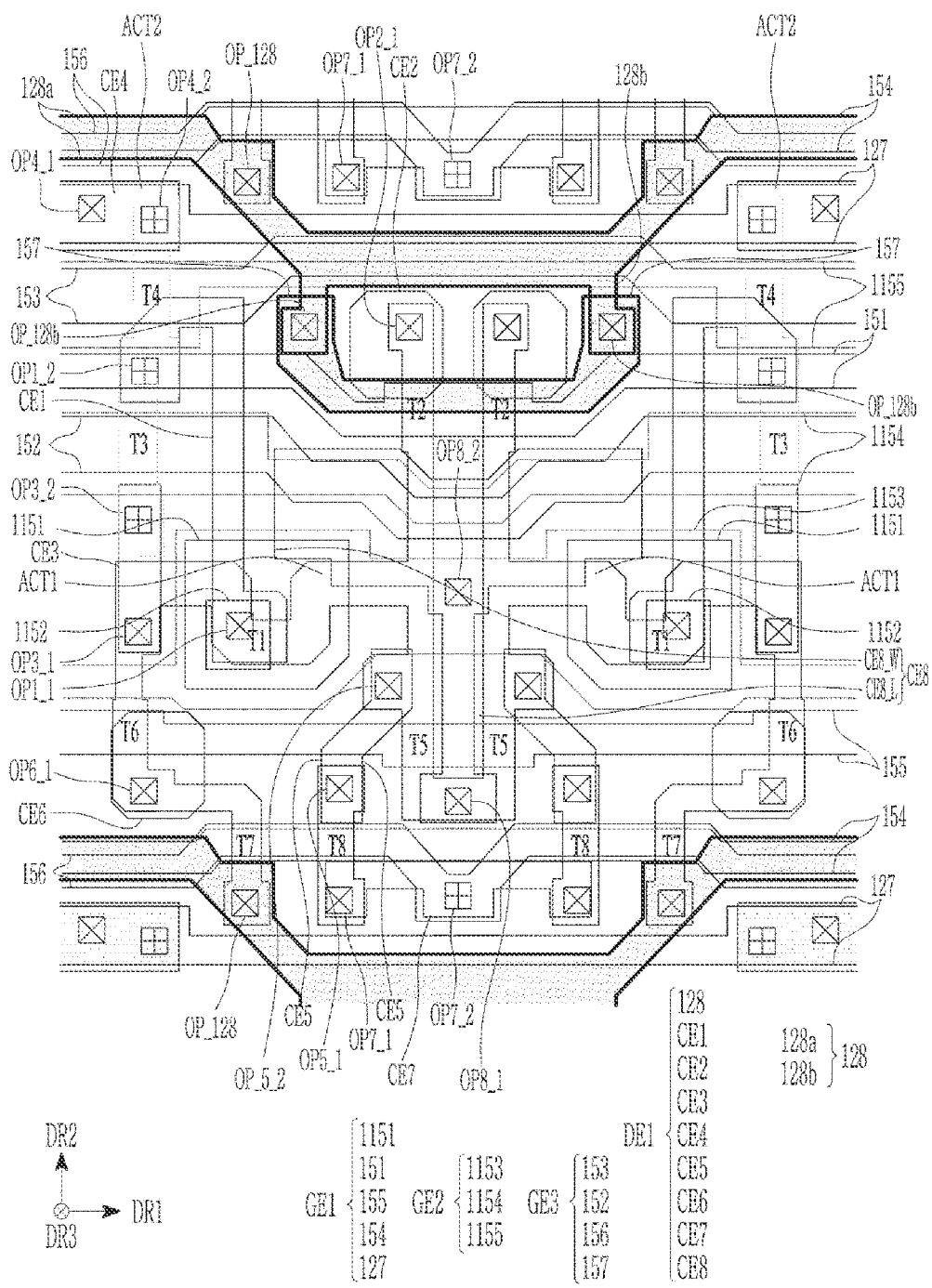

The first data conductive layer DE1 may be located on the second interlayer insulating layer 162. FIG. 10 illustrates the first semiconductor layer ACT1, the first gate conductive layer GE1, the second gate conductive layer GE2, the second semiconductor layer ACT2, the third gate conductive layer GE3, and the first data conductive layer DE1.

The first data conductive layer DE1 may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including the same. For example, the first data conductive layer DE1 may have a triple-layer structure including a lower layer that includes a refractory metal such as molybdenum, chromium, and titanium, or their alloys, an intermediate layer including an aluminum-based metal with low resistivity, a silver-based metal, and a copper-based metal, and an upper layer including refractory metals such as molybdenum, chromium, and titanium.

The first data conductive layer DE1 may include a second initialization voltage line 128, a first connection electrode CE1, a second connection electrode CE2, a third connection electrode CE3, a fourth connection electrode CE4, a fifth connection electrode CE5, a sixth connection electrode CE6, a seventh connection electrode CE7, and eighth connection electrode CE8.

The second initialization voltage line 128 includes a horizontal portion 128a that is arranged along the first direction DR1, and a vertical portion 128b that protrudes in the second direction DR2.

The second initialization voltage line 128 may be connected with the first semiconductor layer ACT1 through the initialization voltage opening OP_128. A second initialization voltage is transmitted to the first semiconductor layer ACT1 through such an opening.

The horizontal portion 128a of the second initialization voltage line 128 may be arranged to be alternately overlapping the reference voltage line 156 and the first initialization voltage line 127 in the third direction DR3 that is perpendicular to the substrate 110. The vertical portion 128b of the second initialization voltage line 128 is connected with the shield electrode 157 through a shield opening OP_128b. Thus, the second initialization voltage may be transmitted to the shield electrode 157.

A width of the horizontal portion 128a arranged between the vertical portions 128b of the second initialization voltage line 128 may be wider than other areas. Thus, as shown in FIG. 4, the second initialization voltage line 128 may be arranged to be covering the initialization control line 153. As described, because a part of the horizontal portion 128a of the second initialization voltage line 128 covers the initialization control line 153 while being widened, coupling between the initialization control line 153 and the second connection electrode CE2 of the first data conductive layer DE1 can be reduced. In addition, as shown in FIG. 4, because most regions of the second overlapped wire 1155 of the second gate conductive layer GE2 are also covered by the second initialization voltage line 128, the coupling between the second overlapped wire 1155, which is the second gate conductive layer GE2, and the second connection electrode CE2, which is the first data conductive layer DE1, can be reduced.

Simultaneously referring to FIG. 3, the first connection electrode CE1 is connected with the gate electrode 1151 of the driving transistor T1 through a 1-1 opening OP1_1, and may be connected with the second semiconductor layer ACT2 through a 1-2 opening OP1_2.

The second connection electrode CE2 may be connected with the first semiconductor layer ACT1 through a 2-1 opening OP2_1.

Simultaneously referring to FIG. 3, the third connection electrode CE3 may be connected with the first semiconductor layer ACT1 through a 3-1 opening OP3_1, and may be connected with the second semiconductor layer ACT2 through a 3-2 opening OP3_2.

Simultaneously referring to FIG. 3, the fourth connection electrode CE4 may be connected with the first initialization voltage line 127 through a 4-1 opening OP4_1, and may be connected with the second semiconductor layer ACT2 through a 4-2 opening OP4_2.

The fifth connection electrode CE5 is connected with the first semiconductor layer ACT1 through a 5-1 opening OP5_1 and a 5-2 opening OP5_2.

The sixth connection electrode CE6 may be connected to the first semiconductor layer ACT1 through a 6-1 opening OP6_1.

The seventh connection electrode CE7 is connected with the first semiconductor layer ACT1 through a 7-1 opening OP7_1, and may be connected with the reference voltage line 156 through a 7-2 opening OP7_2.

The eighth connection electrode CE8 may be connected with the first semiconductor layer ACT1 through an 8-1 opening OP8_1. In addition, the eighth connection electrode CE8 may be connected with the first sustain electrode 1153 through an 8-2 opening OP8_2. It will be described later, but referring to FIG. 2 to FIG. 4, the eighth connection electrode may be supplied with an ELVDD voltage from the driving voltage line 172 through a driving opening OP_172. The eighth connection electrode CE8 may transmit the ELVDD voltage transmitted in the second direction DR2 to the first direction DR1.

Referring to FIG. 10, the eighth connection electrode CE8 includes a stem portion CE8_L arranged along the second direction DR2, and an expansion portion CE8_W extended in the first direction DR1 from the stem portion CE8_L. In the stem portion CE8_L, the eighth connection electrode CE8 may be connected with the first semiconductor layer ACT1 through the 8-1 opening OP8_1, and may be connected with the first sustain electrode 1153 through the 8-2 opening OP8_2. In the expansion portion CE8_W, the eighth connection electrode CE8 may receive the ELVDD voltage by being connected with the driving voltage line 172 through the driving opening OP_172.

Next, referring to FIG. 2 and FIG. 4, the third interlayer insulating layer 180 may be arranged on the first data conductive layer DE1. The third interlayer insulating layer 180 may include an organic insulating material such as a general purpose polymer such as poly(methylmethacrylate) (PMMA) or polystyrene (PS), a polymer derivative having a phenolic group, an acrylic polymer, an imide polymer, a polyimide, and a siloxane polymer.

The second data conductive layer DE2 may be arranged on the third interlayer insulating layer 180. The second data conductive layer DE2 may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including the same.

FIG. 2 illustrates the first semiconductor layer ACT1, the first gate conductive layer GE1, the second gate conductive layer GE2, the second semiconductor layer ACT2, the third gate conductive layer GE3, the first data conductive layer DE1, and the second data conductive layer DE2.

The second data conductive layer DE2 may include the data line 171, the driving voltage line 172, and a connection pattern 177. The data line 171 and the driving voltage line 172 may be arranged along the second direction DR2.

The data line 171 may be connected with the second connection electrode CE2 through a data opening OP_171. Because the second connection electrode CE2 is connected with the first semiconductor layer ACT1 through the 2-1 opening OP2_1, a data voltage of the data line 171 is transmitted to the first semiconductor layer ACT1. Specifically, the data line 171 may be connected with the first electrode of the second transistor T2.

The driving voltage line 172 is arranged along the second direction DR2, and may be connected with the eighth connection electrode CE8 in the driving opening OP_172. For example, the driving voltage line 172 may be connected with the expansion portion CE8_W of the eighth connection electrode CE8.

The driving voltage line 172 is connected with the eighth connection electrode CE8 in the driving opening OP_172, and the eighth connection electrode CE8 is connected with the first sustain electrode 1153 through the 8-2 opening OP8_2, and thus the driving voltage line 172 is connected with the first sustain electrode 1153.

The connection pattern 177 may be connected with the sixth connection electrode CE6 through a first connection opening OP_177_1, and may be connected with an anode through a second connection opening OP_177_2.

According to some embodiments, a protective layer may be arranged on the second data conductive layer DE2 that includes the data line 171 and the driving voltage line 172, and the anode may be arranged on the protective layer. The anode may be connected with the sixth transistor T6, and may receive an output current of the driving transistor T1. A partitioning wall may be arranged on the anode. An opening is formed in the partitioning wall, and the opening of the partitioning wall may overlap the anode. A light emitting element layer may be arranged in the opening of the partitioning wall. A cathode may be arranged on the light emitting element layer and the partitioning wall. The anode, the light emitting element layer, and the cathode may form a light emitting diode LED.

As described above, in the display device according to some embodiments, the third gate conductive layer GE3 includes the shield electrode 157, and the shield electrode 157 is arranged between the second connection electrode CE2, which is the first data conductive layer DE1, and the first scan line 151, which is the first gate conductive layer GE1. Thus, it may be possible to prevent the first gate conductive layer GE1 from being affected by the fluctuation of the data voltage transmitted to the first data conductive layer DE1. That is, the shield electrode 157 can reduce the coupling between the first data conductive layer DE1 and the first gate conductive layer GE1. In addition, according to some embodiments, the width of the horizontal portion 128a arranged between the vertical portions 128b of the second initialization voltage line 128 is wider than other regions. That is, because a part of the horizontal portion 128a of the second initialization voltage line 128 widens and covers the initialization control line 153, the coupling between the initialization control line 153, which is the third gate conductive layer GE3, and the second connection electrode CE2, which is the first data conductive layer DE1, can be reduced.

Figure 11:
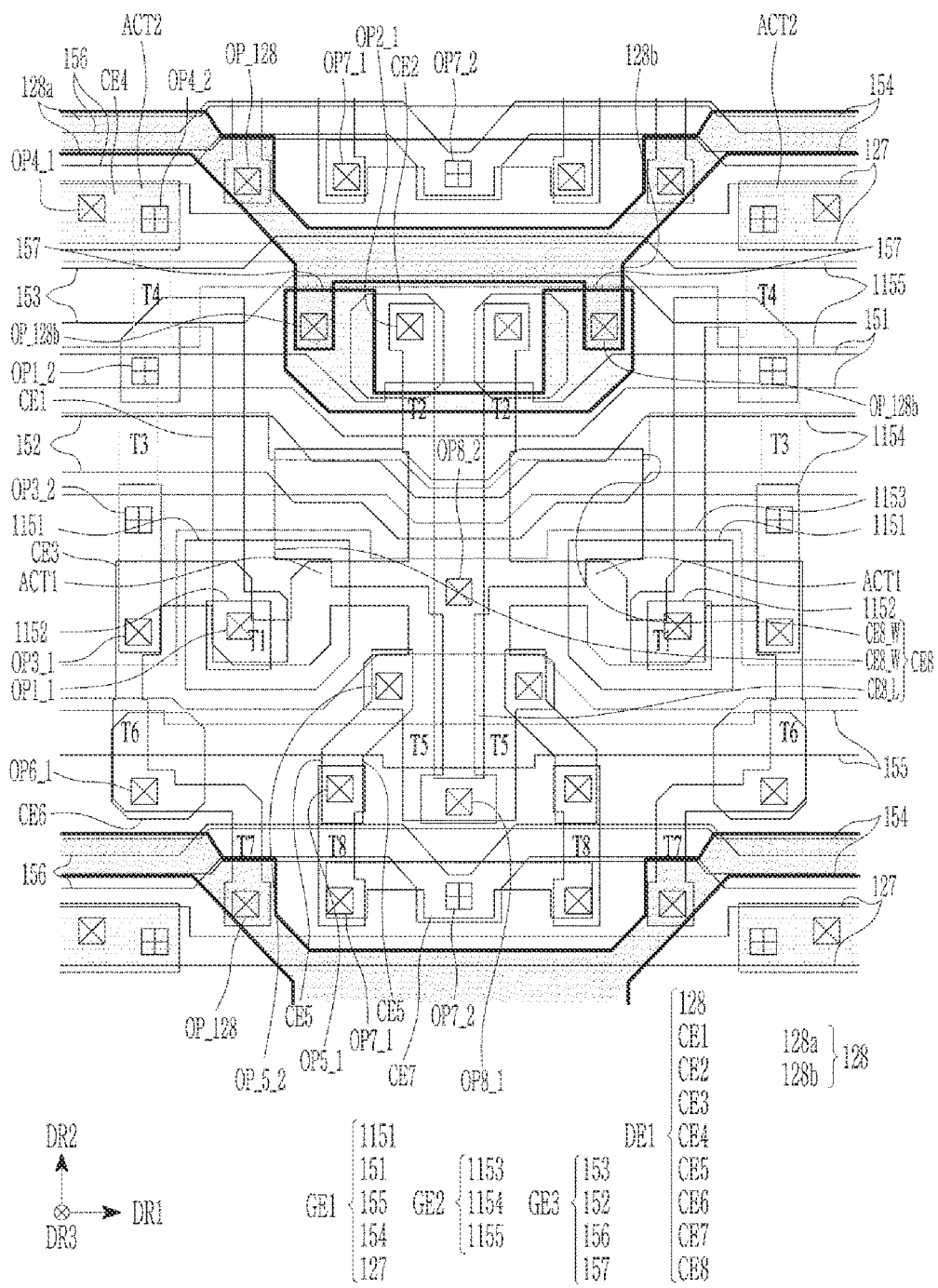
FIG. 11 illustrates further details of the display device along the same plane as illustrated in FIG. 10 according to some embodiments.

FIG. 11 illustrates the same plane as illustrated in FIG. 10 according to some embodiments. Comparing FIG. 11 and FIG. 10, a size of the shield electrode 157 is larger in the embodiments described with respect to FIG. 11 compared to the size of the shield electrode 157 in the embodiments described with respect to FIG. 10. A detailed description of the same constituent element will be omitted.

That is, referring to FIG. 11, the shield electrode 157 may be arranged in a space between a second overlapped wire 1155 and a first scan line 151 in a second direction, while being overlapped with a first scan line 151. For example, the shield electrode 157 may be arranged to cover corners of a second connection electrode CE2 in the second direction, and in this case, coupling between a second connection electrode CE2 and an initialization control line 153 can be further prevented. As shown in FIG. 11, the shield electrode 157 may cover three or more corners of the second connection electrode CE2.

Figure 12:
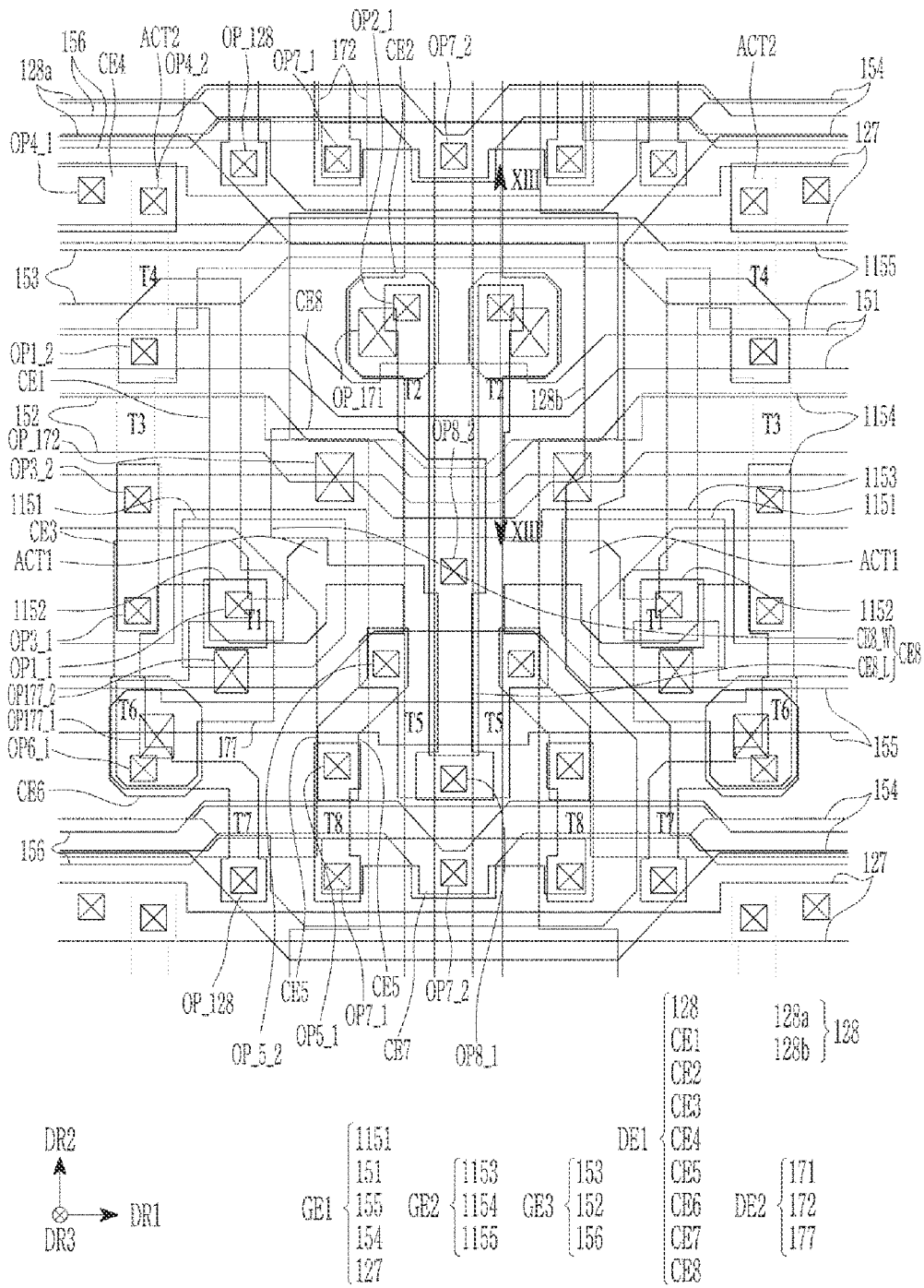
FIG. 12 illustrates further details of the display device at the same area as shown in FIG. 2 with respect to a display device that does not include a shield electrode according to some embodiments.
Figure 13:
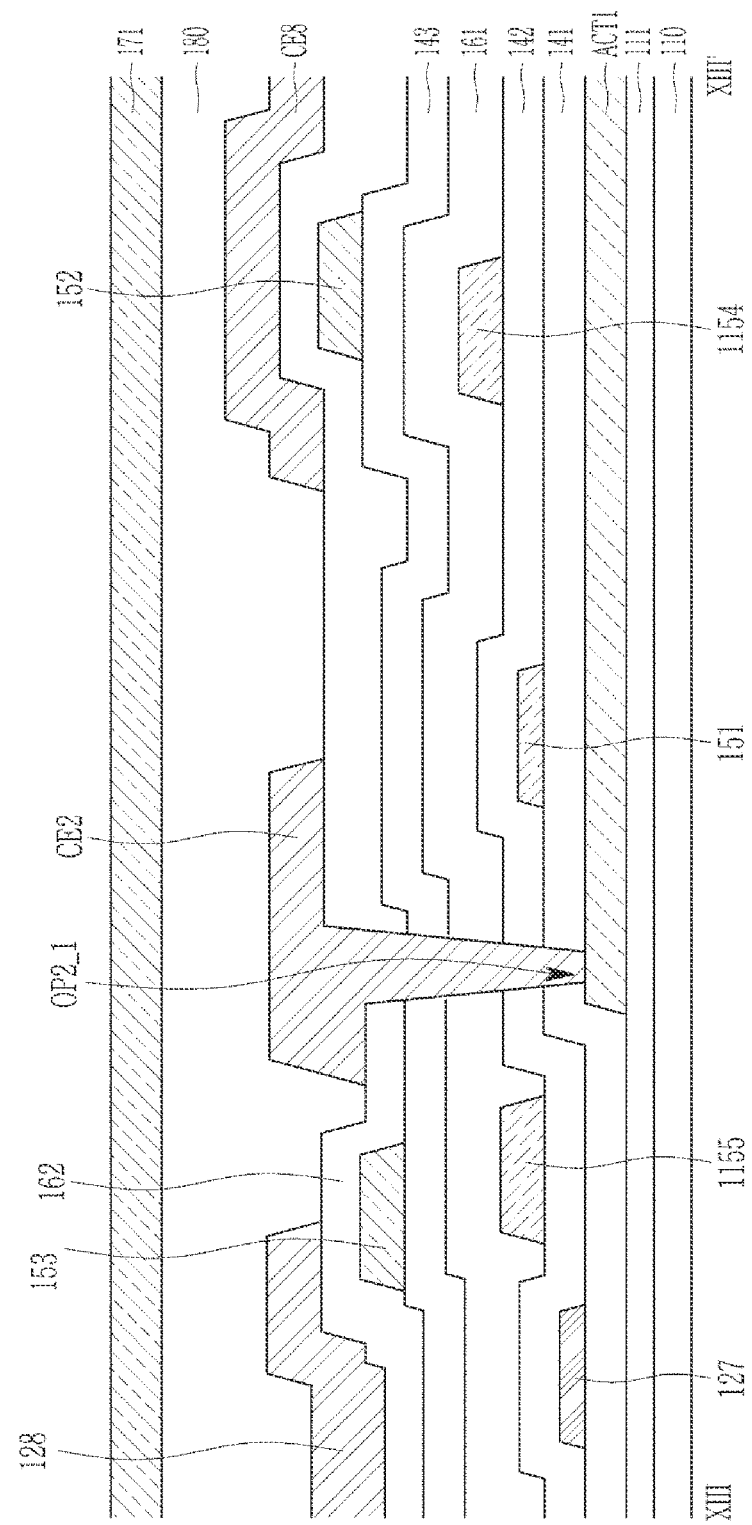
FIG. 13 is a cross-sectional view of FIG. 12, taken along the line XIII-XIII', and illustrates a cross-section of the same area as shown in FIG. 4 according to some embodiments.

FIG. 12 illustrates the same area as shown in FIG. 2 with respect to a display device that does not include a shield electrode 157. FIG. 13 is a cross-sectional view of FIG. 12, taken along the line XIII-XIII', and illustrates a cross-section of the same area as shown in FIG. 4.

Referring to FIG. 12 and FIG. 13, a display device may not include a shield electrode 157. Thus, as shown in FIG. 13, no additional metal layer is arranged between a second connection electrode CE2, which is a first data conductive layer DE1, and a first scan line 151, which is a first gate conductive layer GE1, and the first scan line 151 may be affected by a data voltage applied to the second connection electrode CE2. In addition, in case of the embodiments described with respect to FIG. 12 to FIG. 13, a width of a horizontal portion 128a arranged between vertical portions 128b of a second initialization voltage line 128 is the same as other regions. Thus, one edge of the initialization control line 153 does not overlap the second initialization voltage line 128, and coupling may occur between an initialization control line 153, which is a third gate conductive layer GE3, and a second connection electrode CE2, which is a first data conductive layer DE1.

Figure 14:
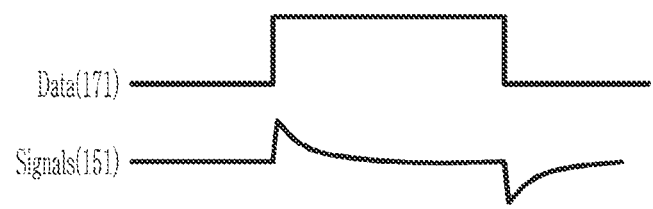
FIG. 14 illustrates voltage fluctuation (signals) of the first scan line according to fluctuation of a voltage Data applied to the data line in the embodiments of FIG. 12 to FIG. 13 according to some embodiments.
Figure 15:
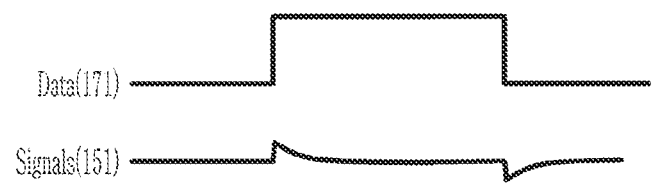
FIG. 15 illustrates voltage fluctuation (signals) of the first scan line according to fluctuation of the voltage Data applied to the data line in the embodiments of FIG. 1 to FIG. 11 according to some embodiments.

FIG. 14 illustrates voltage fluctuation (signals) of the first scan line 151 according to fluctuation of a voltage Data applied to the data line 171 in the embodiments described with respect to FIG. 12 to FIG. 13. FIG. 15 illustrates voltage fluctuation (signals) of the first scan line 151 according to fluctuation of the voltage Data applied to the data line 171 in the embodiments described with respect FIGS. 1 to 11.

Referring to FIG. 14, in case of a display device that does not include a shield electrode 157, a first scan line 151 is coupled due to voltage fluctuation of the data line 171 such that a voltage is significantly fluctuated.

However, referring to FIG. 15, in case of a display device that includes the shield electrode 157, the voltage of the first scan line 151 is not significantly fluctuated even through the voltage of the data line 171 is fluctuated. This is because the shielding electrode 157 arranged between the data line 171 and the first scan line 151 reduces the coupling between the data line 171 and the first scan line 151.

Table 1 show measurement of the degree of coupling between the second connection electrode CE2 and the first scan line 151 and coupling between the second connection electrode CE2 and the initialization control line 153 with respect to each of the display device (Embodiment 1) of FIG. 2, including the first shield electrode, and the display device (Embodiment 2) of FIG. 12, not including the shield electrode. In the embodiments described with respect to (Embodiment 1) FIG. 2, the width of the horizontal portion 128a arranged between the vertical portions 128b of the second initialization voltage line 128 is wider than other regions, and the second initialization voltage line 128 is arranged to be covering the initialization control line 153, but in the embodiments (Embodiment 2) described with respect to FIG. 12, the second initialization voltage line 128 does not cover one edge of the initialization control line 153.

TABLE 1

|  | Coupling between second connection electrode CE2 and first scan line 151 (DATA - GW) | Coupling between second connection electrode CE2 and initialization control line 153 (DATA-GI) |
| --- | --- | --- |
| Embodiment 1 (shield electrode included/second initialization voltage line covers initialization control line) | 4.37E−16 | 3.56E−16 |
| Embodiment 2 (shield electrode not included/second initialization voltage line does not cover initialization control line) | 1.37E−15 | 8.90E−16 |
| Embodiment 1/Embodiment 2 | 31.9% | 40.0% |

As it can be determined in Table 1, coupling between the second connection electrode CE2 and the first scan line 151 was reduced to 31.9% in case of the Embodiment 1 in which the shield electrode 157 is included and the second initialization control line covers one edge of the initialization control line, compared to Embodiment 2 in which the shield electrode 157 is not included and the second initialization control line does not cover one edge of the initialization control line. In addition, compared to Embodiment 2, in Embodiment 1, coupling between the second connection electrode CE2 and the initialization control line 153 was reduce to 40.0%. That is, it was determined that the effect of reducing coupling was remarkable in Embodiment 1 including the shield electrode 157. Table 2 shows measurement of the degree of coupling between the second connection electrode CE2 and the first scan line 151 and coupling between the second connection electrode CE2 and the initialization control line 153 in the display device (Embodiment 3) of FIG. 11, including a shield electrode 157 having a large area, and the display device (Embodiment 2) of FIG. 12, not including the shield electrode.

TABLE 2

|  | Coupling between second connection electrode CE2 and first scan line 151 (DATA - GW) | Coupling between second connection electrode CE2 and initialization control line 153 (DATA-GI) |
| --- | --- | --- |
| Embodiment 3 (shield electrode with large area) | 4.37E−16 | 1.47E−16 |
| Embodiment 2 (not including shield electrode) | 1.37E−15 | 8.90E−16 |
| Embodiment 3/Embodiment 2 | 31.9% | 16.5% |

As it can be determined in Table 2, in case of Embodiment 3 including the shield electrode 157 with the large area, the coupling between the second connection electrode CE2 and the first scan line 151 was reduced to 31.9% compared to Embodiment 2 without the shield electrode 157. In addition, in case of Embodiment 3 including the shield electrode 157, the coupling between the second connection electrode CE2 and the initialization control line 153 is reduced to 16.5% compared to Embodiment 2 without the shield electrode 157. That is, it was determined that the effect of reducing coupling was remarkable in Embodiment 3 including the shield electrode 157. In addition, compared to the simultaneous comparison of Table 1 and Table 2, the coupling between the second connection electrode CE2 and the initialization control line 153 was 1.47E−1 in the case of Embodiment 3 including the shield electrode 157 of the large area, which is lower than 3.56E−16 in the case of Embodiment 1. That is, it was determined that the effect of reducing the coupling was higher in the case of including the shield electrode 157 having a wider area. However, in the case of including the shield electrode 157, an unintended short circuit may occur due to overlapping with the opening in the display device, and thus it may be appropriately arranged in a space in the display device.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims, and their equivalents.

| Description of Some of the Reference Symbols | |
| --- | --- |
| 110: substrate | 111: buffer layer |
| 1151: gate electrode | 1152: opening |
| 1153: first sustain electrode | 1154: first overlapped wire |
| 1155: second overlapped wire | 127: first initialization voltage line |
| 128: second initialization voltage line | 141: first gate insulating layer |
| 142: second gate insulating layer | 151: first scan line |
| 152: second scan line | 153: initialization control line |
| 154: bypass control line | 155: light emission control line |
| 157: shield electrode | |
| 161: first interlayer insulating layer | |
| 162: second interlayer insulating layer | |
| 171: data line | 172: driving voltage line |
| 177: connection pattern | 180: third interlayer insulating layer |
| 191: pixel electrode | PX: pixel |
| ACT1: first semiconductor layer | ACT2: second semiconductor layer |

What is claimed is:

1. A display device comprising:
   a substrate;
   a first scan line arranged along a first direction on the substrate;
   a shield electrode overlapping a part of the first scan line in a direction that is perpendicular to a plane of the substrate;
   a second connection electrode on the shield electrode; and
   a data line arranged along a second direction on the second connection electrode, the data line being connected with the second connection electrode and overlapping the second connection electrode in a direction that is perpendicular to a plane of the substrate,
   wherein the shield electrode overlaps the first scan line and the second connection electrode in the direction that is perpendicular to the plane of the substrate.

2. The display device of claim 1, wherein the shield electrode is between the second connection electrode and the first scan line in an area where the second connection electrode and the first scan line overlap in a direction that is perpendicular to a plane of the substrate.

3. The display device of claim 1, wherein one edge of the second connection electrode overlaps the shield electrode in a direction that is perpendicular to a plane of the substrate.

4. The display device of claim 1, further comprising an initialization control line, a second scan line, and a reference voltage line that are on a same layer as the shield electrode,
   wherein the initialization control line, the second scan line, and the reference voltage line are arranged along the first direction.

5. The display device of claim 4, further comprising a second initialization voltage line that is on the same layer as the second connection electrode,
   wherein the second initialization voltage line further comprises a horizontal portion arranged along the first direction, and a plurality of horizontal portions protruding to the second direction.

6. The display device of claim 5, wherein the initialization control line wholly overlaps the horizontal portion of the second initialization voltage line in a direction that is perpendicular to a plane of the substrate in the horizontal portion between vertical portions of the second initialization voltage line.

7. The display device of claim 5, wherein the shield electrode is connected with the second initialization voltage line and is configured to receive a second initialization voltage.

8. The display device of claim 1, wherein the shield electrode overlaps three or more corners of the second connection electrode in a direction that is perpendicular to a plane of the substrate.

9. The display device of claim 4, further comprising:
   a first semiconductor layer between the substrate and the first scan line; and
   a second semiconductor layer arranged along a second direction on the first scan line,
   wherein the first semiconductor layer comprises a polysilicon semiconductor layer, and the second semiconductor layer comprises an oxide semiconductor layer.

10. The display device of claim 9, wherein the second semiconductor layer overlaps the second scan line and the initialization control line in a direction that is perpendicular to a plane of the substrate.

11. The display device of claim 9, further comprising a first initialization voltage line, a light emission control line, and a bypass control line that are on a same layer as the first scan line,
    wherein the first initialization voltage line, the light emission control line, and the bypass control line are arranged along the first direction, and
    the first initialization voltage line and the first scan line overlap the second semiconductor layer in a direction that is perpendicular to a plane of the substrate.

12. The display device of claim 11, wherein
    the light emission control line and the bypass control line overlap the first semiconductor layer in a direction that is perpendicular to a plane of the substrate.

13. The display device of claim 12, wherein
    the first semiconductor layer forms six transistors, and
    the second semiconductor layer forms two transistors.

14. The display device of claim 1, further comprising:
    a driving voltage line that is on a same layer as the data line, and is arranged along the second direction;
    an eighth connection electrode that is on a same layer as the second connection electrode;
    wherein the driving voltage line and the eighth connection electrode are connected with each other.

15. A display device comprising:
    a substrate;
    a first semiconductor layer on the substrate;
    a first gate conductive layer on the first semiconductor layer;
    a second gate conductive layer on the first gate conductive layer;
    a second semiconductor layer on the second gate conductive layer;
    a third gate conductive layer on the second semiconductor layer;
    a first data conductive layer on the third gate conductive layer;
    a second data conductive layer on the first data conductive layer; and
    a third data conductive layer comprises a shield electrode,
    wherein the first gate conductive layer comprises a first scan line,
    the first data conductive layer comprises a second connection electrode, and
    the shield electrode overlaps the first scan line and the second connection electrode in a direction that is perpendicular to a plane of the substrate.

16. The display device of claim 15, wherein
    the first data conductive layer further comprises a second initialization voltage line, and
    the shield electrode is configured to supply a second initialization voltage from the second initialization voltage line.

17. The display device of claim 15, wherein
    the second data conductive layer further comprises a data line,
    the data line is connected with the second connection electrode and is configured to supply a data voltage to the second connection electrode, and
    the second connection electrode is connected with the first semiconductor layer.

18. The display device of claim 16, wherein
    the second initialization voltage line further comprises a horizontal portion arranged along a first direction and a plurality of horizontal portions protruding in a second direction, and a width of the horizontal portion of the second initialization voltage line between vertical portions is wider than other regions.

19. The display device of claim 15, wherein the shield electrode overlaps three or more corners of the second connection electrode in a direction that is perpendicular to a plane of the substrate.

20. The display device of claim 15, wherein
the first semiconductor layer comprises a polysilicon semiconductor, and
the second semiconductor layer comprises an oxide semiconductor.

* * * * *